US008830721B2

(12) United States Patent
Buer et al.

(10) Patent No.: US 8,830,721 B2
(45) Date of Patent: *Sep. 9, 2014

(54) ENCODED READ-ONLY MEMORY (ROM) BITCELL, ARRAY, AND ARCHITECTURE

(71) Applicant: Broadcom Corporation, Irvine, CA (US)

(72) Inventors: Myron Buer, Savage, MN (US); Dechang Sun, Eden Prairie, MN (US); Duane Jacobson, Gilbert, AZ (US); David William Knebelsberger, Tempe, AZ (US); Kevin LeClair, Prior Lake, MN (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/779,298

(22) Filed: Feb. 27, 2013

(65) Prior Publication Data

US 2013/0170277 A1 Jul. 4, 2013

Related U.S. Application Data

(63) Continuation of application No. 12/970,416, filed on Dec. 16, 2010, now Pat. No. 8,406,031.

(60) Provisional application No. 61/320,126, filed on Apr. 1, 2010.

(51) Int. Cl.
*G11C 17/00* (2006.01)

(52) U.S. Cl.
USPC .................................. 365/104; 365/189.05

(58) Field of Classification Search
USPC ................. 365/203, 230.03, 104, 189.05
See application file for complete search history.

(56) References Cited

U.S. PATENT DOCUMENTS

| 6,654,273 | B2 | 11/2003 | Miwa et al. | |
|---|---|---|---|---|
| 6,744,667 | B2 | 6/2004 | Yamamoto et al. | |
| 7,193,924 | B2 | 3/2007 | Ramaraju et al. | |
| 2004/0071010 | A1* | 4/2004 | Wei et al. ................. | 365/154 |
| 2005/0276094 | A1 | 12/2005 | Yamaoka et al. | |
| 2005/0281077 | A1 | 12/2005 | Nii | |
| 2007/0279990 | A1 | 12/2007 | Choy | |
| 2008/0291769 | A1 | 11/2008 | Nii | |
| 2009/0027987 | A1 | 1/2009 | Dray et al. | |
| 2009/0083495 | A1 | 3/2009 | Khellah et al. | |
| 2009/0244955 | A1 | 10/2009 | Sasaki | |
| 2011/0128795 | A1* | 6/2011 | Lee et al. ................. | 365/189.05 |
| 2011/0273919 | A1 | 11/2011 | Buer et al. | |

* cited by examiner

*Primary Examiner* — Michael Tran
(74) *Attorney, Agent, or Firm* — Sterne, Kessler, Goldstein & Fox P.L.L.C.

(57) ABSTRACT

Embodiments provide improved memory bitcells, memory arrays, and memory architectures. In an embodiment, a memory cell comprises a transistor having drain, source, and gate terminals; and a plurality of program nodes, with each of the program nodes charged to a pre-determined voltage and coupled to a respective one of a plurality of bit lines.

20 Claims, 9 Drawing Sheets

ENCODED READ-ONLY MEMORY (ROM) BITCELL, ARRAY, AND ARCHITECTURE

CROSS-REFERENCE TO RELATED APPLICATION(S)

The present application is a continuation of U.S. patent application Ser. No. 12/970,416, filed on Dec. 16, 2010, which claims the benefit of U.S. Provisional Patent Application No. 61/320,126 filed on Apr. 1, 2010, both of which are incorporated herein by reference in their entireties.

BACKGROUND

1. Field of the Invention

The present invention relates generally to memory bitcells, arrays, and architectures.

2. Background Art

Today, various products and applications (e.g., Bluetooth products, WLAN products, mobile baseband and multimedia processors, etc.) require significant amounts of on-chip read-only memory (ROM).

Conventional ROM bitcells, bitcell arrays, and memory architectures suffer from a number of problems, including area inefficiency, high cost, and high power consumption due to high leakage, for example.

There is a need therefore for improved ROM bitcells, bitcell arrays, and memory architectures.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 3A:
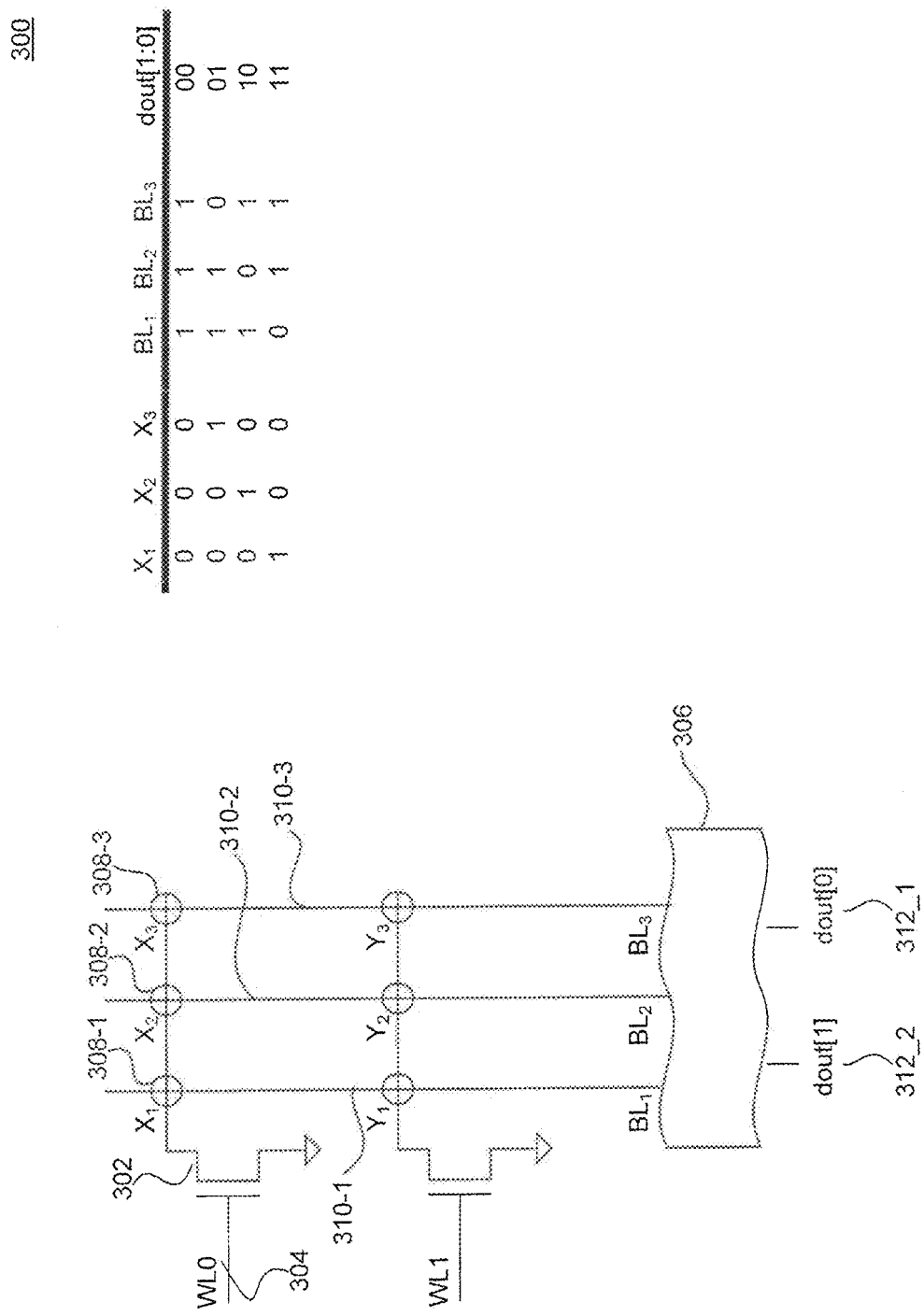
Figure 3B:
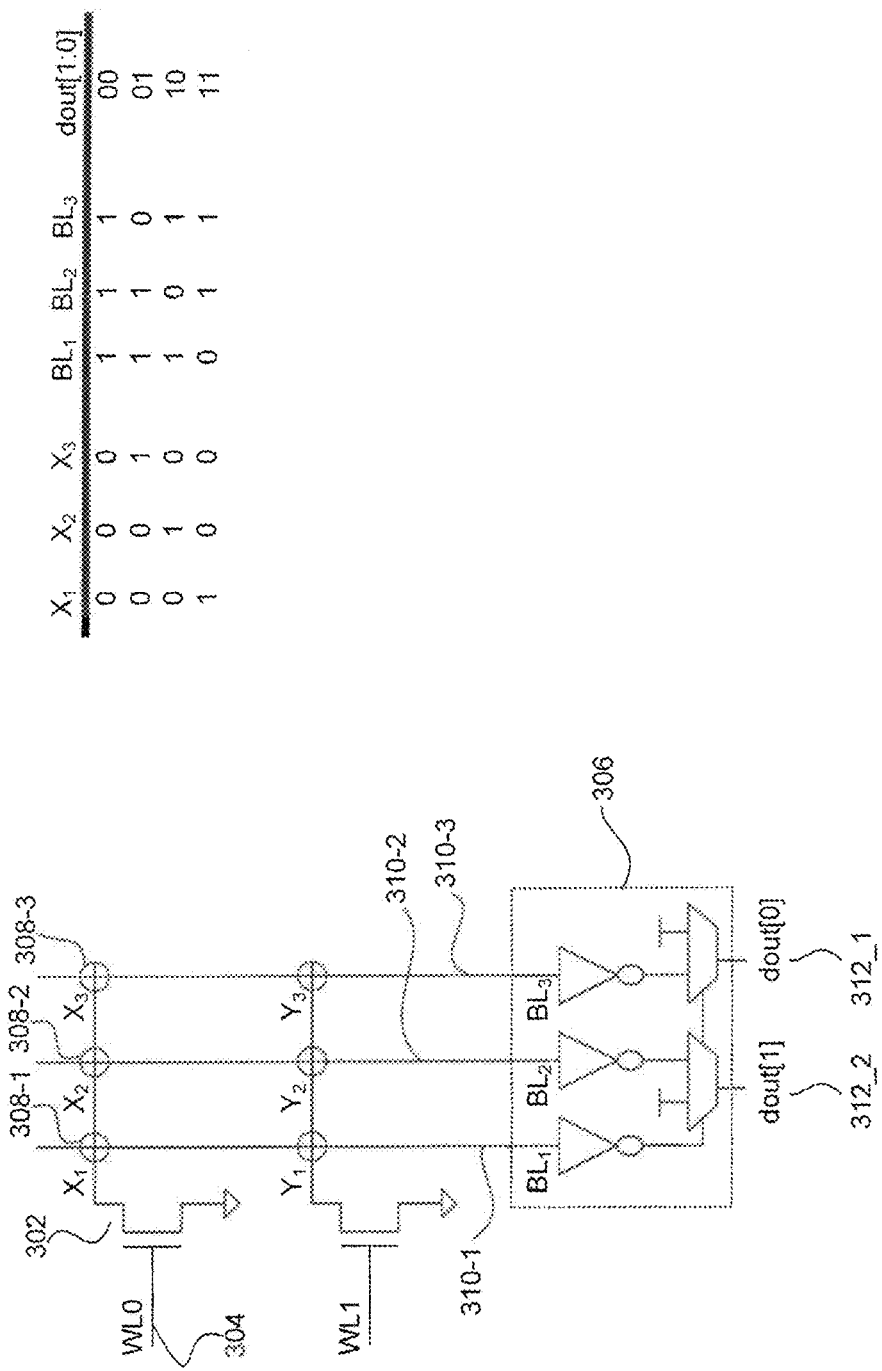

FIG. 3A-B illustrate an example memory array according to an embodiment of the present invention.

Figure 4:
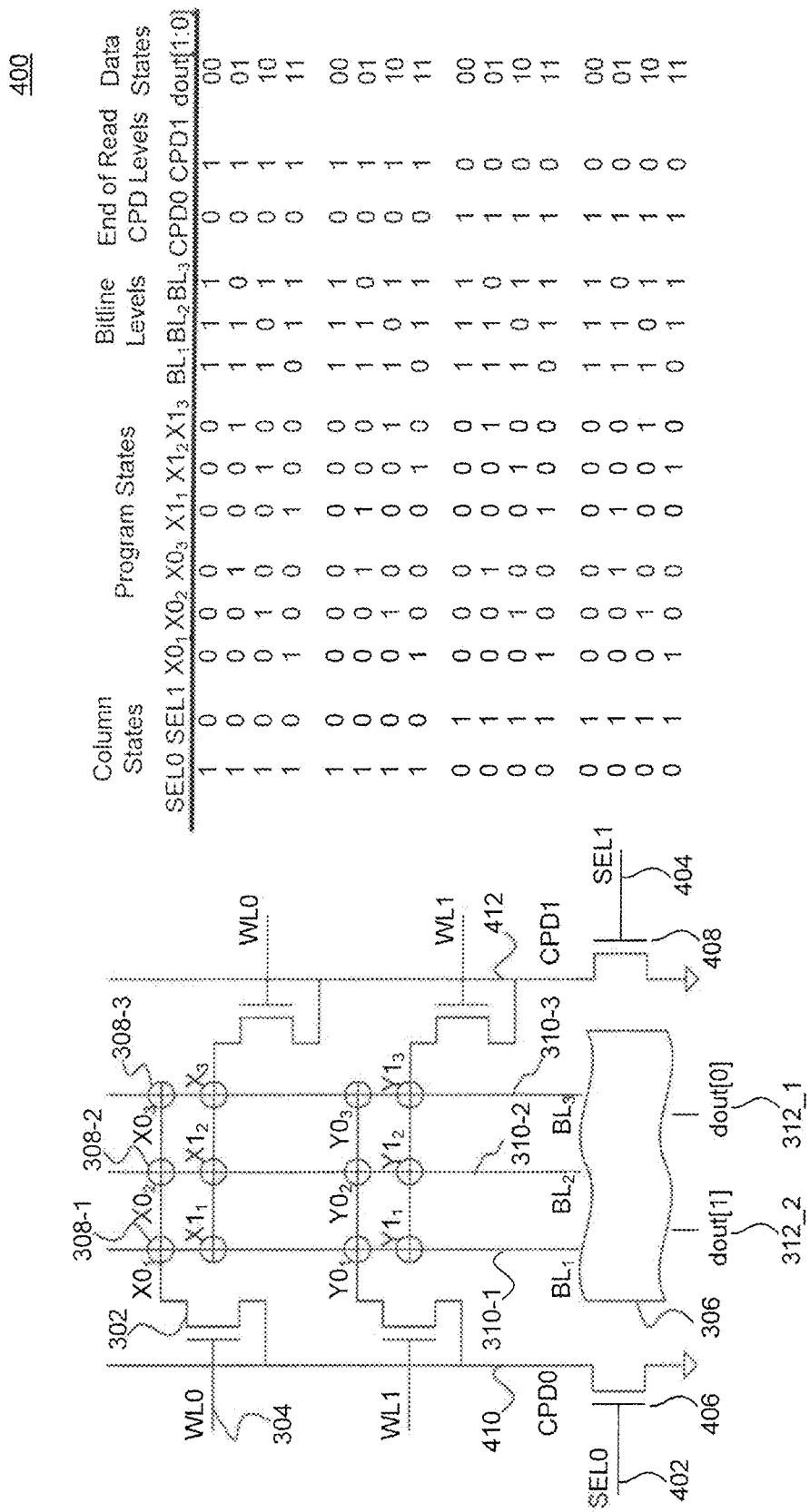

FIG. 4 illustrates an example memory array according to an embodiment of the present invention.

Figure 5:
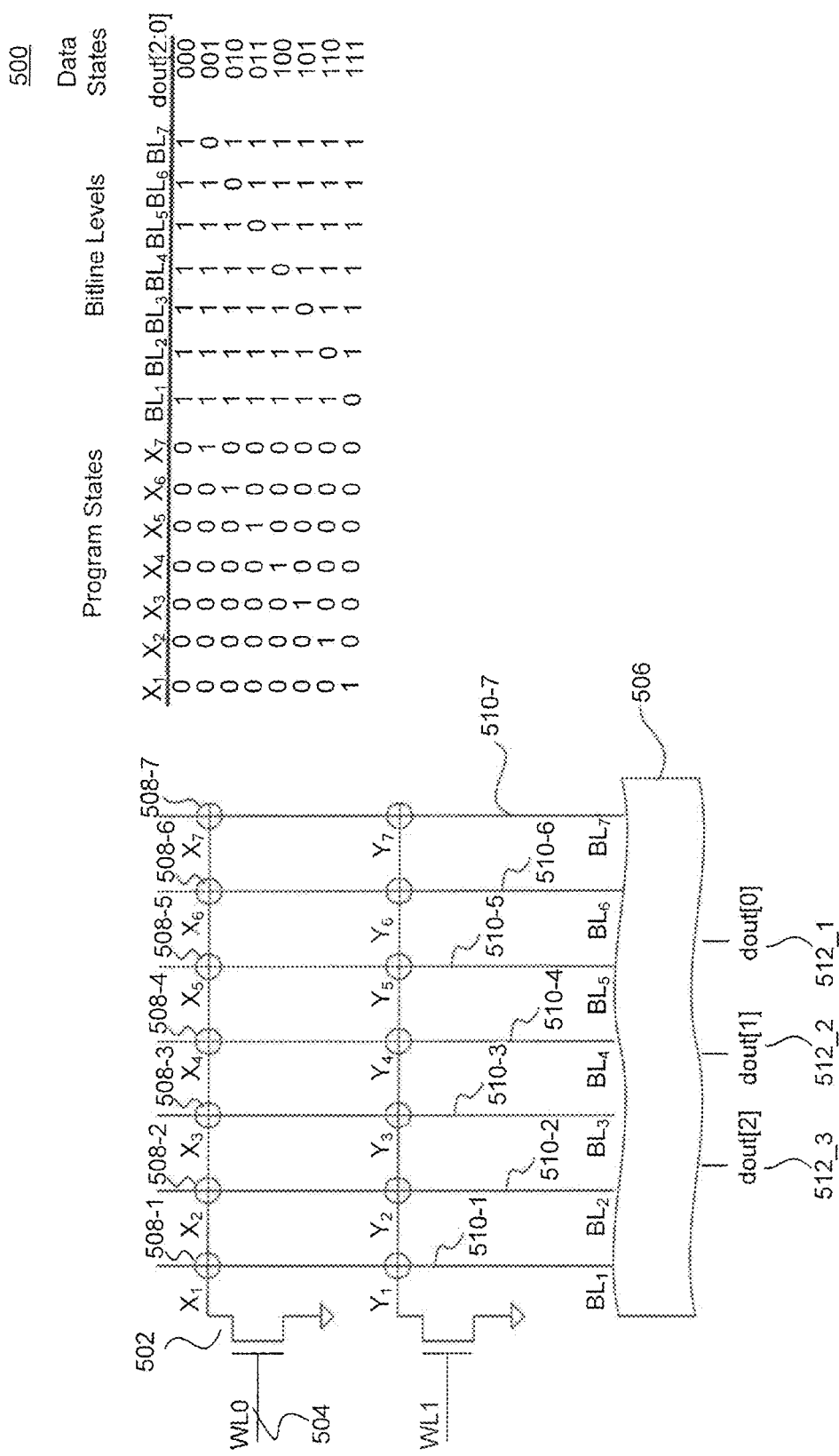

FIG. 5 illustrates an example memory array according to an embodiment of the present invention.

Figure 6A:
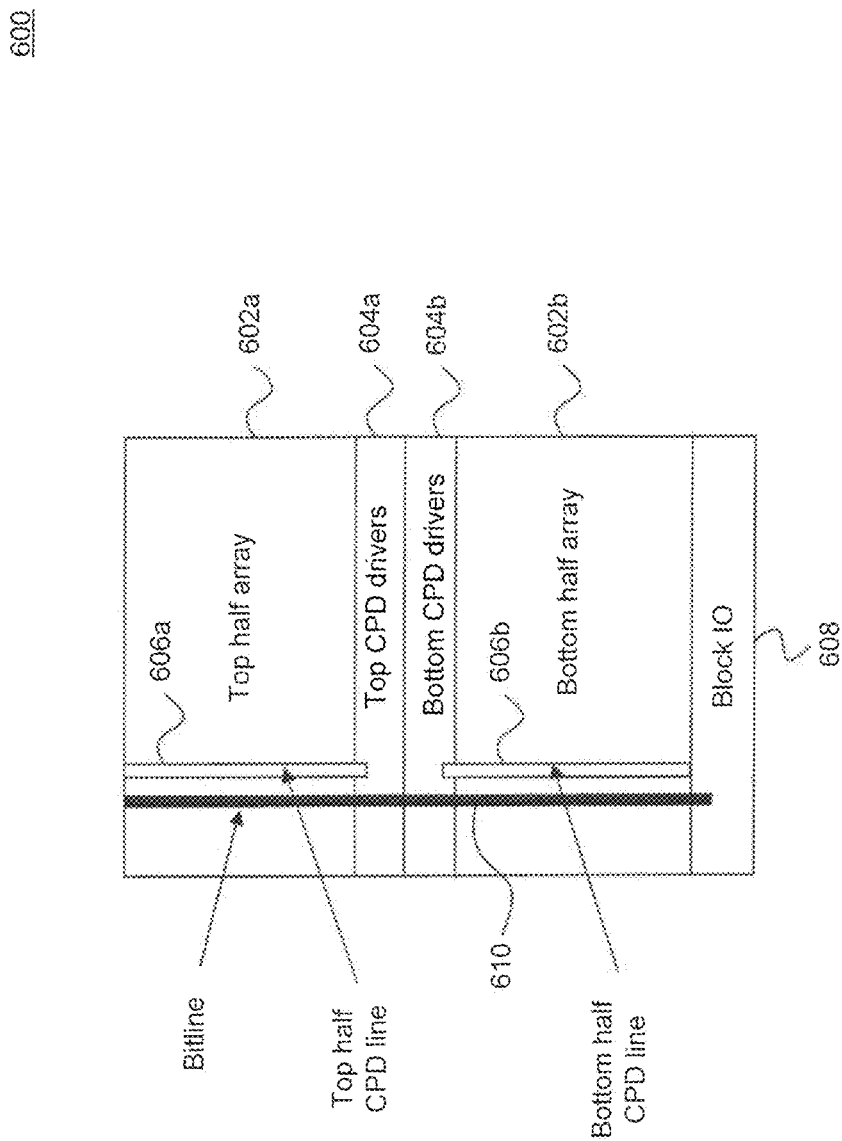

FIG. 6A illustrates an example architecture of a memory array according to an embodiment of the present invention.

Figure 6B:
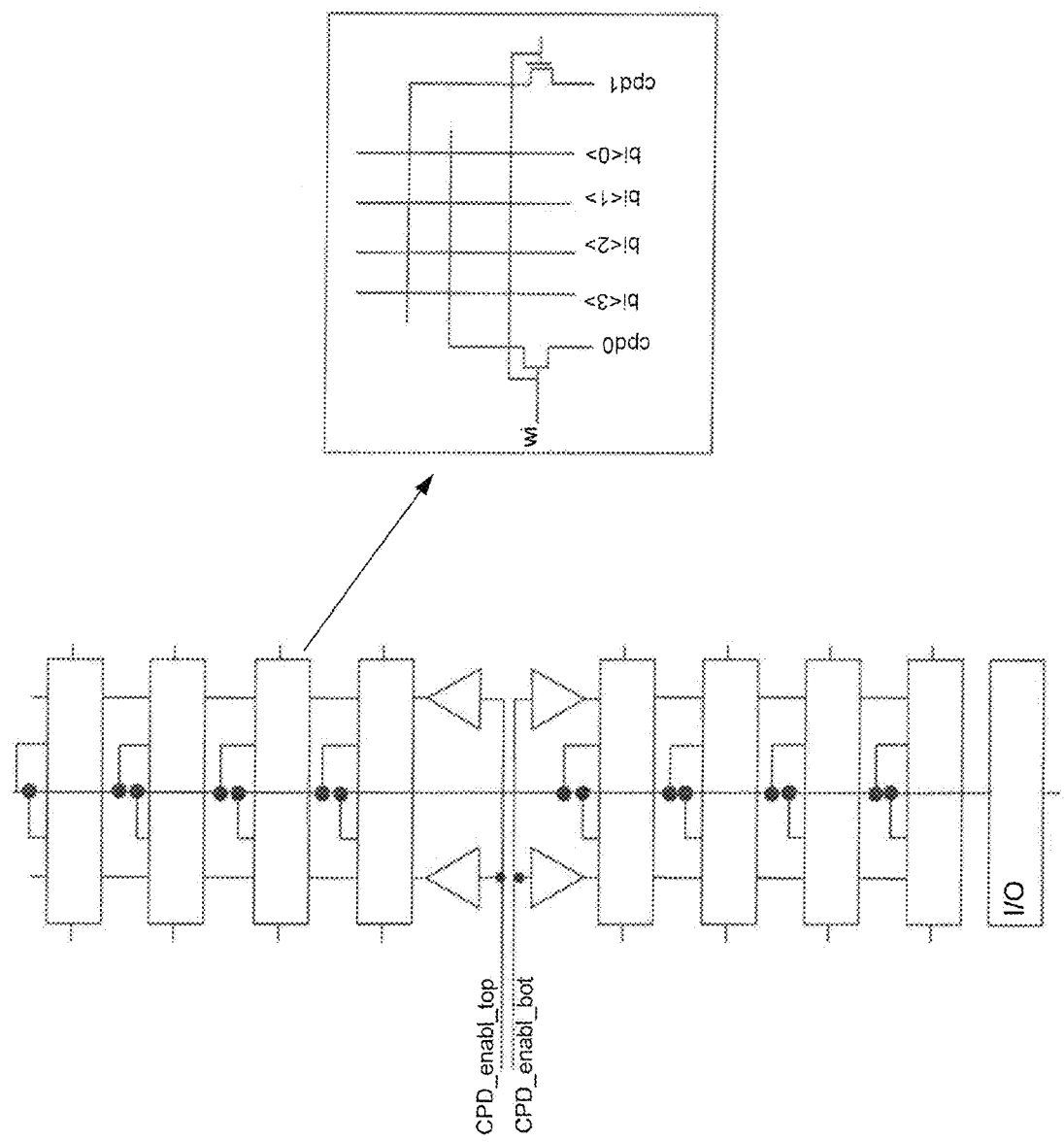

FIG. 6B is a circuit diagram that illustrates the example memory array architecture of FIG. 6A.

Figure 7:
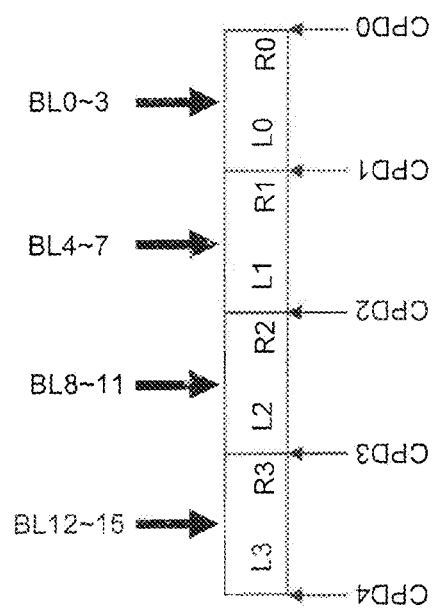

FIG. 7 illustrates an example memory according to an embodiment of the present invention.

The present invention will be described with reference to the accompanying drawings. Generally, the drawing in which an element first appears is typically indicated by the leftmost digit(s) in the corresponding reference number.

DETAILED DESCRIPTION OF EMBODIMENTS

Figure 1:
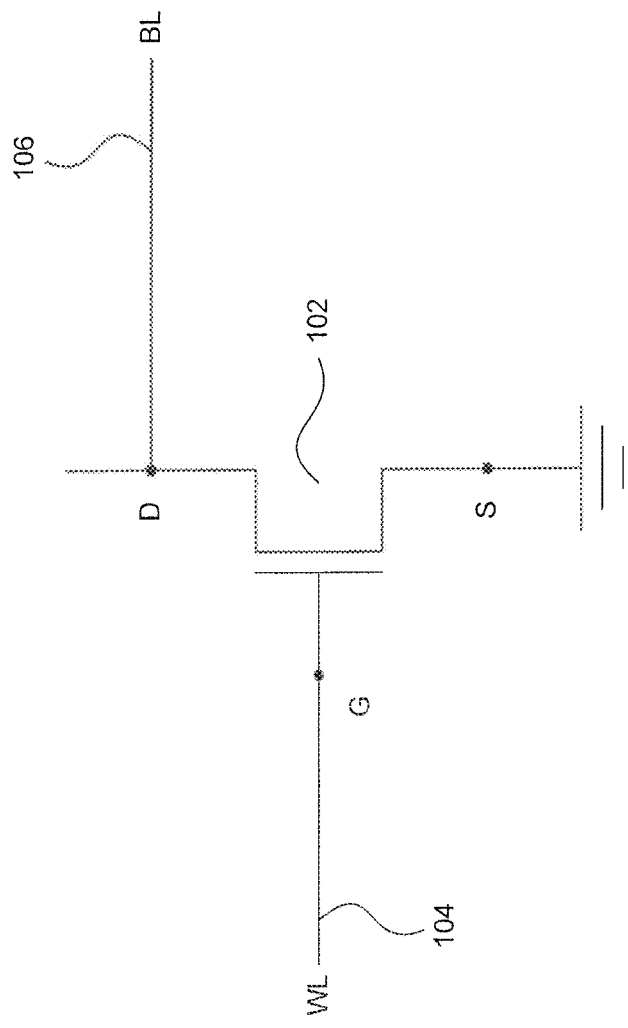
FIG. 1 illustrates a conventional memory bitcell.

FIG. 1 illustrates a conventional ROM bitcell 100. As shown in FIG. 1, bitcell 100 includes a MOS (Metal Oxide Semiconductor) transistor 102. Typically, the source terminal of MOS transistor 102 is coupled to ground, and the drain terminal of MOS transistor 102 is pre-charged to a pre-determined voltage value. The gate terminal of MOS transistor 102 is coupled to a word line (WL) 104, and the drain terminal of MOS transistor 102 is selectively connected (either coupled or not) to a bit line (BL) 106 (depending on whether a logic 1 or a logic 0 is programmed in the bitcell).

In standby mode (i.e., when bitcell 100 is not being read), a low voltage (e.g., ground) is applied on WL 104. When bitcell 100 is being read, the voltage on WL 104 is raised (or in other words, WL 104 is activated) and MOS transistor 102 will turn ON. Consequently, the voltage on BL 106 would either pull down to ground if the drain terminal of MOS transistor 102 is coupled to BL 106 or remain at its initial value, thereby reflecting the logic value stored in the bitcell. For example, the voltage on BL 106 would fall to a low value when a 1 is stored in bitcell 100, and remain high when a 0 is stored in bitcell 100. Generally, a sensing structure (e.g., inverter circuit) is used to sense the voltage on BL 106, and output the logic value corresponding to the voltage.

Various techniques exist for programming bitcell 100. For example, bitcell 100 may be programmed at manufacture time by masking. Accordingly, the combination/pattern of conductive/insulation layers and vias act to connect the drain terminal of bitcell 100 to a first voltage supply if a logic 1 is to be stored in bitcell 100, and to a second voltage supply if a logic 0 is to be stored in bitcell 100. When data programming is done by masking, the data programmed in bitcell 100 may not be changed during operation. Alternative techniques can be used if re-programming of the data is desired.

As described above, conventional bitcell 100 allows for a single logic state or bit to be stored therein. As a result, when large amounts of ROM are needed, conventional bitcell array solutions tend to be large in area and thus high in cost. Embodiments of the present invention, as further described below, provide improved ROM bitcell structures, bitcell arrays, and ROM architectures having increased data storage capabilities, smaller area, lower cost, and significantly reduced power consumption/loss.

Figure 2:
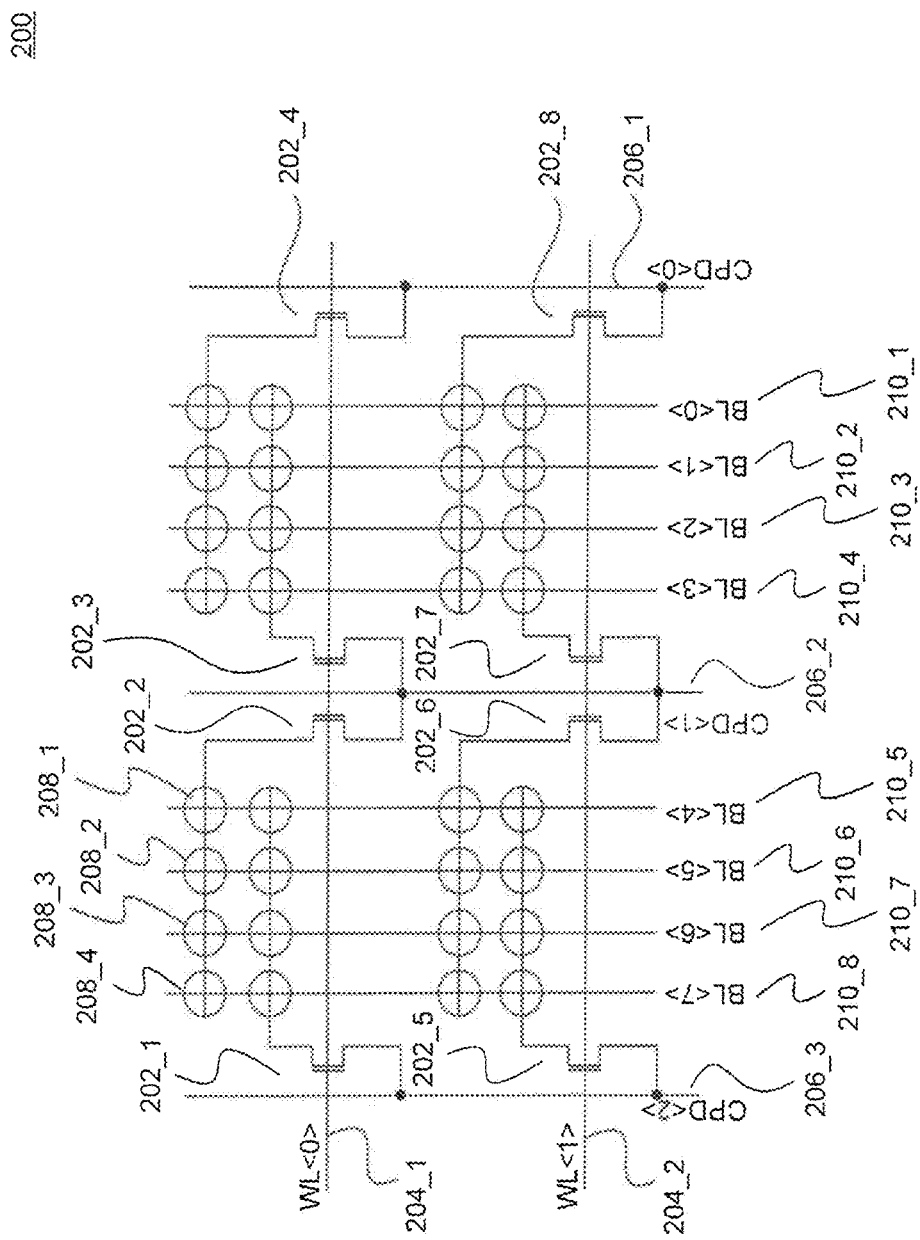
FIG. 2 illustrates an example memory array according to an embodiment of the present invention.

FIG. 2 illustrates an example memory array 200 according to an embodiment of the present invention. Memory array 200 represents an encoded ROM array according to an embodiment of the present invention. For simplification purposes, only two rows and four columns of example memory array 200 are shown in FIG. 2. However, as would be understood by a person of skill in the art based on the teachings herein, example memory array 200 may include any number of rows/columns, depending on the use requirements of the array.

As shown in FIG. 2, example memory array 200 includes a plurality of memory cells, with each memory cell including a MOS transistor 202 and four associated program nodes 208. For example, MOS transistor 202-2 and program nodes 208_1, 208_2, 208_3, and 208_4 comprise one memory cell of memory array 200. Thus, example memory array 200 includes eight memory cells as shown in FIG. 2.

Each memory cell of example memory array 200 can be programmed to store two bits of data (00, 01, 10, and 11), by connecting only one of its associated program nodes to the drain terminal of its MOS transistor. The logic state (i.e., 00, 01, 10, or 11) stored in the memory cell is determined by which of its associated program nodes is coupled to the drain terminal of its MOS transistor. For example, to store a "00" in the memory cell of MOS transistor 202_2, the drain terminal of MOS transistor 202_2 may be coupled to program node 208_4. To store a "01" in the same memory cell, the drain terminal of MOS transistor 202_2 may be coupled to program node 208_3, and so on.

As shown in FIG. 2, each memory cell of example memory array 200 is coupled through its associated program nodes 208 to four bit lines 210. Bit lines 210 are used to read out the data stored in the memory cell. For example, the memory cell of MOS transistor 202_2 is coupled through its associated program nodes 208_1, 208_2, 208_3, and 208_4 to four bit lines 210_5, 210_6, 210_7, and 210_8. To reduce area, bit lines 210 are shared vertically and horizontally among multiple memory cells. For example, bit lines 210_1 through 210_4 are shared vertically by the memory cells of MOS transistors 202_3 and 202_7, and 202_4 and 202_8; and are shared horizontally by the memory cells of MOS transistors 202_3 and 202_4, and 202_7 and 202_8.

In addition, each memory cell is associated with one word line and one CPD (common pull down) line which are activated (i.e., pulled high or low) to access the data stored in the memory cell. The word line is coupled to the gate terminal of the MOS transistor of the memory cell, and the CPD line is coupled to the source terminal of the MOS transistor of the memory cell.

Further, to minimize area, word lines and CPD lines can be shared among memory cells according to embodiments of the present invention. For example, in memory array 200, the memory cells of MOS transistors 202_1, 202_2, 202_3, and 202_4 share the same WL 204_1, and are said to have the same row memory address. Similarly, memory cells having adjacent column memory address may share the same CPD line. For example, in memory array 200, the memory cells of MOS transistors 202_2, 202_3, 202_6, and 202_7 share the same CPD line 206_2.

Generally, example memory array 200 is data programmed such that only memory cells of same row address (i.e., same WL) and that share a CPD line need to be accessed simultaneously. This allows for the vertical/horizontal sharing of bit lines, as described above, to be possible. For example, referring to FIG. 2, the memory cells of MOS transistors 202_2 and 202_3 will be read out together. With each memory cell providing two bits of data, 4 bits of data can be decoded from bit lines 210_1 through 210_8 by reading the memory cells of MOS transistors 202_2 and 202_3 together.

To access a given memory cell, its associated WL and CPD line are activated simultaneously. For example, to access the memory cell of MOS transistor 202_2, both WL 204_1 and CPD line 206_2 are activated. In an embodiment, this includes switching WL 204_1 from low (e.g., ground) to high (e.g., Vdd) and pulling down CPD line 206_2 from high (e.g., Vdd) to low (e.g., ground). Program nodes 208 (of every memory cell) are pre-charged to a high value voltage before each read cycle. Thus, when WL 204_1 and CPD 206_2 are activated, MOS transistor 202_2 turns ON, causing the program node actually connected to the drain terminal of MOS transistor 202_2 to fall down from its pre-charged high value voltage to a low voltage. Because only one of program nodes 208_1, 208_2, 208_3, and 208_4 is connected to the drain terminal of MOS transistor 202_2, when MOS transistor 202_2 turns ON, a single one of program nodes 208_1, 208_2, 208_3, and 208_4 will fall and the others will continue to reflect the high voltage value. The falling program node determines the logic state stored in the memory cell.

In an embodiment, a sensing circuit (e.g., a differential sense amplifier), not shown in FIG. 2, is coupled to bit lines 210_1 through 210_8 in order to decode the voltage value transitions on bit lines 210_1 through 210_8 into data. The sensing circuit outputs 2 bits based on bit lines 210_1 through 210_4 and 2 bits based on bit lines 210_5 through 210_8. The sensing circuit only needs partial bit line swing to correctly sense the data. The smaller bit line swing translates into less power consumption and higher speed.

As would be understood by a person skilled in the art based on the teachings herein, memory cell/array embodiments are not limited to 2-bit memory cells as described above in FIG. 2, but extend to n-bit memory cells where n is any integer number. Further, embodiments are not limited to the example memory cell structure in FIG. 2 (i.e., with four program nodes per memory cell), but extend to memory cell structures having more or less than four program nodes per memory cell and more or less than four bit lines coupled to each memory cell. Additional example memory arrays according to embodiments are provided below for further illustration.

FIGS. 3A-B illustrate an example memory array 300 according to an embodiment of the present invention. For simplification purposes, a single column of the memory array is shown in FIGS. 3A-B. Therefore, CPD lines are omitted, and the source terminals of the MOS transistors 302 are shown being coupled to ground. However, a person of skill in the art would appreciate based on the teachings herein that example memory array 300 can implemented using a CPD functionality as described above in FIG. 2, for example.

As shown in FIG. 3A, each memory cell in example array 300 includes a MOS transistor 302 and three associated program nodes 308_1, 308_2, and 308_3. The gate terminal of MOS transistor 302 is coupled to a word line (WL) 304, which is raised high when the memory cell is being accessed. Program nodes 308_1, 308_2, and 308_3 are coupled to respective bit lines 310_1, 310_2, and 310_3, which are used to read the data stored in the memory cell. In an embodiment, bit lines 310_1, 310_2, and 310_3 are input into a decoder circuit 306, which generates data signals 312_1 and 312_2 that represent the data stored in the memory cell. An example embodiment of decoder circuit 306 is shown in FIG. 3B.

Each memory cell in example array 300 can be programmed to store up to two bits. In an embodiment, programming is performed by connecting at most one of the associated program nodes 308 of the memory cell to the drain terminal of the MOS transistor of the memory cell. Thus, the logic state (i.e., 00, 01, 10, or 11) stored in the memory cell is determined by which, if any, of its associated program nodes is coupled to the drain terminal of its MOS transistor. For example, as illustrated by the truth table shown in FIG. 3A, a "00" logic state is programmed in the memory cell by not connecting any of program nodes 308_1, 308_2, and 308_3 to the drain terminal of MOS transistor 302. Thus, when WL 304 is raised, each of bit lines 310_1, 310_2, and 310_3 will remain high (i.e., floating), to reflect the "00" encoded state. Similarly, to encode a "01" logic state, only program node 308_3 is connected to the drain terminal of MOS transistor 302, and program nodes 308_1 and 308_2 are kept floating.

It is noted that example memory array 300 requires three program nodes per memory cell (compared to four in example array 200) and three bit lines per memory column (bit lines can also be shared between adjacent columns). Thus, chip area is saved.

FIG. 4 illustrates another example memory array 400 according to an embodiment of the present invention. Example memory array 400 uses a similar 2-bit memory cell structure as described above in FIGS. 3A-3B. In addition, example memory array 400 uses a CP) functionality as described above with reference to FIG. 2. In particular, example array 400 includes first and second CPD lines 410 and 412 for selecting the memory column being accessed (the word lines 304 select the memory row being accessed). In an embodiment, CPD lines 410 and 412 are controlled respectively by select signals 402 and 404. For example, as shown in FIG. 4, select signals 402 and 404 drive respectively the gate terminals of transistors 406 and 404, with CPD line 410 being connected to the drain terminal of transistor 406 and CPD line 412 being connected to the drain terminal of transistor 408.

To enable sharing of bit lines 308 among memory columns, select signals 402 and 404 are controlled so that one or the other is high at any given time. This in turn ensures that one or the other of CPD lines 410 and 412 is active at any given time, and that no two adjacent column memory cells (sharing the same bit lines 308) are accessed simultaneously.

FIG. 5 illustrates another example memory array 500 according to an embodiment of the present invention. For simplification purposes, a single column of the memory array is shown in FIG. 5. Therefore, CPD lines are omitted, and the source terminals of the MOS transistors 502 are shown being coupled to ground. However, a person of skill in the art would appreciate based on the teachings herein that example memory array 500 can implemented using a CPD functionality as described above in FIGS. 2 and 4, for example.

Example memory array 500 is similar to example memory array 300 described above with reference to FIGS. 3A-3B, with a difference being that example array 500 uses 3-bit memory cells (compared to 2-bit memory cells in example array 300). Thus, each memory cell in example array 500 includes a MOS transistor 502 and seven associated program nodes 508_1 through 508_7. The gate terminal of MOS transistor 502 is coupled to a word line (WL) 504, which is raised high when the memory cell is being accessed. Program nodes 508_1 through 508_7 are coupled to respective bit lines 510_1 through 510_7, which are used to read the data stored in the memory cell. In an embodiment, bit lines 510_1 through 510_7 are input into a decoder circuit 506, which generates data signals 512_1, 512_2, and 512_3 that represent the 3-bit data stored in the memory cell.

As in example array 300, programming of a memory cell is performed by connecting at most one of the associated program nodes 508 of the memory cell to the drain terminal of the MOS transistor of the memory cell. Thus, the logic state (i.e., 000, 001, 010, etc.) stored in the memory cell is determined by which, if any, of its associated program nodes is coupled to the drain terminal of its MOS transistor. For example, as illustrated by the truth table shown in FIG. 5, a "000" logic state is programmed in the memory cell by not connecting any of program nodes 508 to the drain terminal of MOS transistor 502. Thus, when WL 504 is raised, each of bit lines 510_1 through 510_7 will remain high (i.e., floating), to reflect the "000" encoded state. Similarly, to encode a "001" logic state, only program node 508_7 is connected to the drain terminal of MOS transistor 302, and program nodes 508_1 through 508_6 are kept floating.

Encoded ROM memory cells and arrays result in chip area savings compared to conventional designs, as discussed above. However, memory architecture also plays a role in reducing power consumption and improving speed in a ROM. In the following, an example architecture of a memory array that can be used to further enhance embodiments of the present invention is presented. This example architecture is provided for the purpose of illustration only, and is not limiting of embodiment of the present invention.

FIG. 6A illustrates an example architecture of a memory array according to an embodiment of the present invention. For simplification purposes, a single memory block 600 of the memory array is shown in FIG. 6A. However, as would be understood by a person skilled in the art based on the teachings herein, a memory array according to embodiments would include multiple memory blocks (like block 600), replicated both vertically and horizontally.

In a first aspect, the example architecture of FIG. 6A uses a block architecture, in which the memory array is divided into multiple blocks vertically. As a result, each block has fewer rows, and the bit lines and CPD lines used to access the memory block are shorter. With lower load on the bit lines and CPD lines, power consumption and bit line speed is improved. Further, bit line decoding is improved with shorter bit lines.

In another aspect, power consumption may be reduced further by dividing memory block 600 into a top half array 602a and a bottom half array 602b. Separate CPD lines 606a and 606b are used to drive respectively the top and bottom half arrays 602a and 602b. For example, to access a memory row in top half array 602a, only CPD line 606a is pulled down. Accordingly, both load and leakage on the CPD lines is reduced, which results in improved power consumption. In addition, CPD lines 606a and 606b can be made shorter (than in the case of a single shared CPD line) by placing their respective drivers, CPD drivers 604a and 604b, between top and bottom half arrays 602a and 602b. This results in a further reduction in CPD line leakage and power consumption.

Additionally, by ensuring that memory cells (of same row) that share the same CPD line are accessed at the same time, the number of times that CPD lines are activated can be reduced. This is illustrated in FIG. 7, which shows an example memory 700 according to an embodiment of the present invention. Example memory 700 includes 4 pairs of transistors (shown as L0, R0, L1, R1, L2, R2, L3, R3) and five CPD lines (CPD0, CPD1, CPD2, CPD3, and CPD4). When CPD1 is activated, for example, transistors L0 and R1 are accessed.

In an embodiment, CPD line activation can be reduced by programming, for example, bit 0 and bit 1 of a 4-bit word to transistor L0, and bit 2 and bit 3 of the same 4-bit word to transistor R1. Thus, the entire 4-bit word can be read by the activation of a single CPD line, CPD1. Similarly, the bits of a 8-bit word can be programmmed such that only two CPD lines need to be activated (e.g., CPD1 and CPD3) to read the 8-bit word. This results in further power savings in the operation of the memory.

FIG. 6B is a circuit diagram that further illustrates the example memory array architecture of FIG. 6A. In particular, FIG. 6B shows a memory block having eight rows, further divided into a top half array and a bottom half array. Separate CPD lines drive respectively the top and bottom half arrays. It is noted that FIG. 6B in fact shows two adjacent memory blocks that share bit lines. Thus four total CPD lines are shown.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A memory block, comprising:
   a first memory array, including a first memory cell;
   a second memory array, including a second memory cell;
   a first common pull down (CPD) line selectively controlled to access the first memory cell;
   a second CPD line selectively controlled to access the second memory cell; and
   a shared bit line set, coupled to the first memory array and the second memory array, configured to read the first memory cell and the second memory cell.

2. The memory block of claim 1, further comprising:
   a first CPD driver configured to drive the first CPD line; and
   a second CPD driver configured to drive the second CPD line.

3. The memory block of claim 2, further comprising:
   a block input/output (I/O) circuitry configured to decode the shared bit line set to generate a data signal.

4. The memory block of claim 3, wherein the first CPD driver and the second CPD driver are placed between the first memory array and the second memory array, thereby enabling reduction of respective lengths of the first CPD line and the second CPD line.

5. The memory block of claim 2, wherein the first CPD driver and the second CPD driver are configured to drive the first CPD line and the second CPD line such that the shared bit line set reads only one of the first memory cell and the second memory cell at a given time.

6. The memory block of claim 1, wherein at least one of the first and second memory cells comprises:
   a transistor having drain, source, and gate terminals; and
   a plurality of program nodes, each of said program nodes charged to a pre-Determined voltage and coupled to a respective bit line of the shared bit line set.

7. The memory block of claim 6, wherein at most one of the plurality of program nodes is coupled to the drain terminal of the transistor.

8. A memory having a plurality of rows of memory cells, comprising:
   a plurality of memory blocks, each including respective rows of the plurality of rows of memory cells of the memory,
   wherein each of the plurality of memory blocks comprises a dedicated respective bit line set, a common pull down (CPD) line set, and block input/output (I/O) circuitry, wherein the CPD line set is selectively asserted to access a memory cell of said each of the plurality of memory blocks.

9. The memory of claim 8, wherein at least one memory block of the plurality of memory blocks comprises:
   a first memory array, including a first memory cell;
   a second memory array, including a second memory cell;
   a first common pull down (CPD) line configured to access the first memory cell;
   a second CPD line configured to access the second memory cell; and
   a shared bit line set, coupled to the first memory array and the second memory array, configured to read the first memory cell and the second memory cell.

10. The memory of claim 9, wherein the at least one memory block further comprises:
    a first CPD driver configured to drive the first CPD line; and
    a second CPD driver configured to drive the second CPD line.

11. The memory of claim 8, wherein each of the memory cells has a respective row address and a respective column address, and
    wherein same row address memory cells of the memory cells share a common word line.

12. A memory cell, comprising:
    a transistor having drain, source, and gate terminals; and
    a plurality of program nodes, each of the plurality of program nodes charged to a pre-determined voltage,
    wherein at most one of the plurality of program nodes is selectively coupled to the drain terminal of the transistor to program the memory cell to store at least one information bit.

13. The memory cell of claim 12, wherein each of the plurality of program nodes is coupled to a respective one of a plurality of bit lines.

14. The memory cell of claim 12, wherein exactly one of the plurality of program nodes is coupled to the drain terminal of the transistor.

15. The memory cell of claim 12, wherein none of the plurality of program nodes is coupled to the drain terminal of the transistor.

16. The memory cell of claim 12, wherein a value of the at least one information bit stored in the memory cell is determined based on which, if any, of the plurality of program nodes is coupled to the drain terminal of the transistor.

17. The memory cell of claim 12, wherein the program nodes are charged to the pre-determined voltage at manufacture time.

18. The memory cell of claim 12, wherein the plurality of program nodes comprise four program nodes, and wherein at most one of the four program nodes is coupled to the drain terminal of the transistor to program the memory cell to store two information bits.

19. The memory cell of claim 12, wherein the plurality of program nodes comprise three program nodes, and wherein at most one of the three program nodes is coupled to the drain terminal of the transistor to program the memory cell to store two information bits.

20. The memory cell of claim 12, wherein the plurality of program nodes comprise seven program nodes, and wherein at most one of the seven program nodes is coupled to the drain terminal of the transistor to program the memory cell to store three information bits.

* * * * *

UNITED STATES PATENT AND TRADEMARK OFFICE
CERTIFICATE OF CORRECTION

PATENT NO.         : 8,830,721 B2
APPLICATION NO.    : 13/779298
DATED              : September 9, 2014
INVENTOR(S)        : Buer et al.

Page 1 of 1

It is certified that error appears in the above-identified patent and that said Letters Patent is hereby corrected as shown below:

In the Claims

In column 7, line 35, claim 6, please replace "pre-Determined" with --pre-determined--.

Signed and Sealed this
Twenty-fourth Day of February, 2015

Michelle K. Lee
*Deputy Director of the United States Patent and Trademark Office*